ELECTRICAL CONNECTORS FOR TERMINATING LEADS OF MICROMODULAR COMPONENTS OR THE LIKE

Original Filed Aug. 23, 1965 3 Sheets-Sheet 1

United States Patent Office 3,514,746

Patented May 26, 1970

3,514,746

ELECTRICAL CONNECTORS FOR TERMINATING LEADS OF MICROMODULAR COMPONENTS OR THE LIKE

Richard John O'Neill, Camp Hill, and Robert John Kinkaid, New Cumberland, Pa., assignors to AMP Incorporated, Harrisburg, Pa.

Original application Aug. 23, 1965, Ser. No. 481,663, now Patent No. 3,409,857, dated Nov. 5, 1968. Divided and this application July 17, 1968, Ser. No. 745,620

Int. Cl. H01r *11/08*

U.S. Cl. 339—276 3 Claims

ABSTRACT OF THE DISCLOSURE

An electrical connection comprises a ferrule surrounding a conductive lead and having a base against which the lead is positioned as well as opposed inner sections engaging the lead, the opposed sections extending across the base toward one another and meeting at about a plane extending through a longitudinal axis of the ferrule, and outer sections extending away from the plane which engage the inner sections and press the sections against the base.

CROSS-REFERENCE AND RELATED APPLICATION

This is a division of application Ser. No. 481,663, filed Aug. 23, 1965, now Pat. No. 3,409,857.

SPECIFICATION

This invention relates to electrical connectors and more particularly to electrical connectors for terminating leads of micromodular components or the like.

In the field of micromodular components, such as for example, that of the flat pack variety, leads extending outwardly therefrom have to be terminated in order to connect the components with other circuitry to formulate a complete circuit arrangement. In view of the smallness of these components, termination of the leads thereof has been a problem, and solving of the termination problem for these components has been of significant importance since the effective use of these components is a prevalent concept in present and furture electronic design capabilities. Another problem of terminating leads of micromodular components is that of subjecting the termination of the components to high speed terminating techniques which is receptive to automation capabilities. A further problem of terminating leads of micromodular components is that of providing terminations thereof having high reliability. An additional problem of terminating leads of micromodular components is that care must be taken so that the leads are properly terminated to prevent shorting of one lead to another and that the leads are not disconnected from the components during the termination operation. A primary object of the invention is to provide electrical connectors for terminating leads of relatively small or micromodular components.

Another object of the invention is to provide electrical connectors for terminating leads of relatively small or micromodular components that is susceptible to high speed or automation capabilities.

A further object of the invention is the provision of an electrical connector for terminating leads of relatively small or micromodular components having high reliability, the leads are properly terminated without shorting of one lead to another and the leads are not disconnected from the components during the termination operation.

An additional object of the invention is to provide a unique crimp configuration between leads and crimping ferrules and a method to form such crimp configuration.

A still further object of the invention is to provide an electrical connection that has excellent mechanical and electrical characteristics and does not damage the connections of the leads from which they emanate.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

The foregoing objects are achieved in the present invention through the provision of a connector construction having a carrier member for carrying a micromodular component having leads extending outwardly therefrom, pin members disposed in the carrier member including crimping members for receiving the leads and in which the leads are crimped to provide a carrier assembly unitable to a board or mounting means for interconnection with other circuitry.

Figures 1, 2:
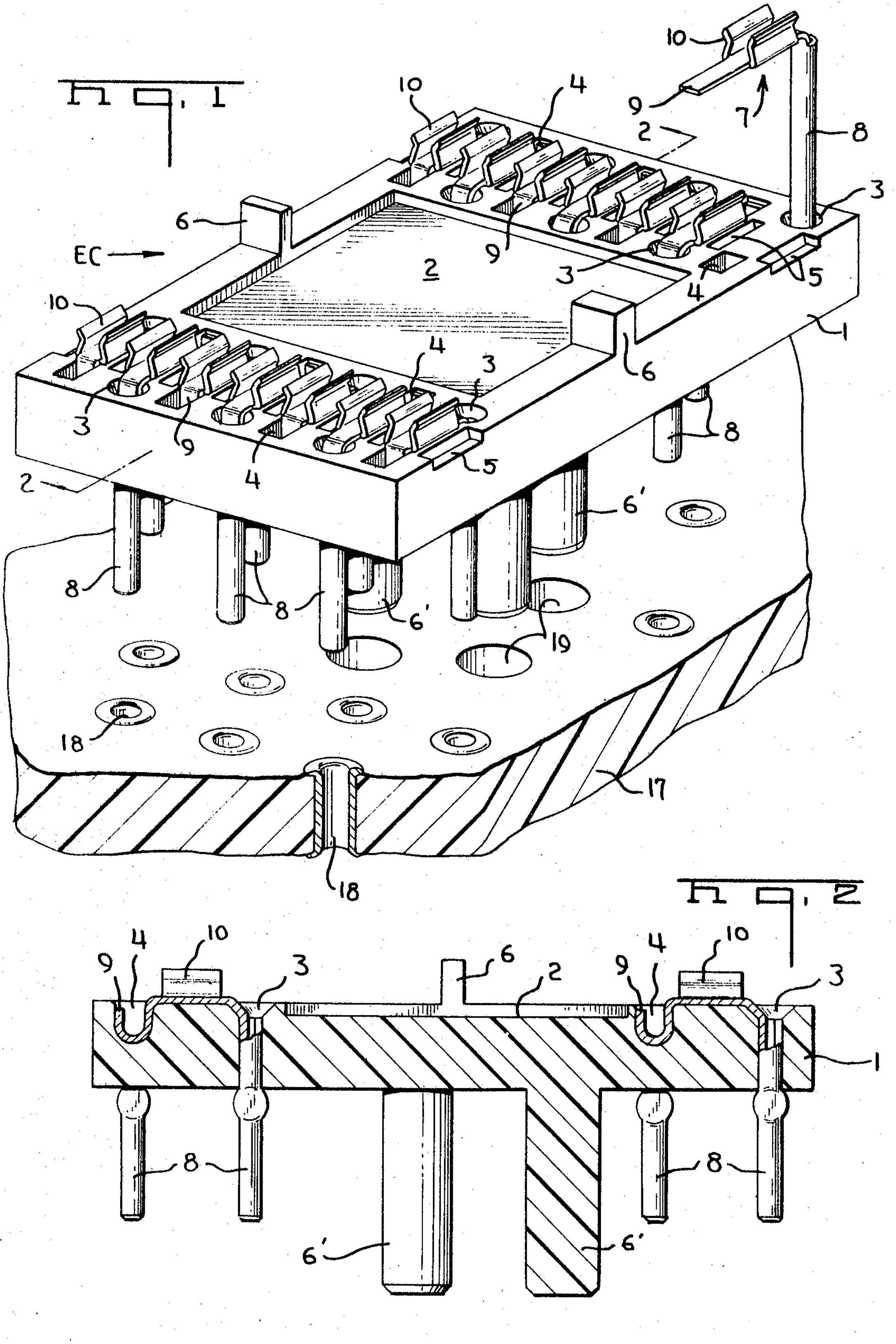
FIG. 1 is an exploded perspective and broken sectional view of an electrical connector according to the present invention and a mounting means.
FIG. 2 is a view taken along lines 2—2 of FIG. 1.

Turning now to the drawings and more particularly FIGS. 1 through 5, there is illustrated an electrical connector EC comprising a dielectric carrier member 1 having a rectangular recess 2 disposed in the top surface thereof. Openings 3 extend through carrier member 1 on each side of recess 2 and these openings are disposed in staggered relationship along each side of recess 2. The entrances to openings 3 in the upper surface of carrier member 1 are preferably countersunk. Depressions 4 are disposed opposite each opening 3 causing these depressions to be also arranged in staggered relationship. As can be discerned, the bottoms of depressions 4 are preferably arcuate shaped. Channels 5 are disposed between openings 3 and depressions 4. Projections 6 extend outwardly from the upper surface of dielectric carrier member 1 adjacent the ends of recess 2.

Extensions 6′ extend outwardly from the bottom surface of carrier member 1 and are preferably six in number. Extensions 6′ are arranged in any suitable manner but are preferably disposed to define a pentagonal configuration with one extension disposed within the pentagon. These extensions are useful to provide a keying arrangement to assure proper positioning of the connector onto a mounting member so that the micromodular component on the carrier member is properly positioned on the mounting member in accordance with its electrical characteristics. The use of the keying arrangement will be discussed in greater detail hereinafter.

Figures 3, 4, 5, 6:
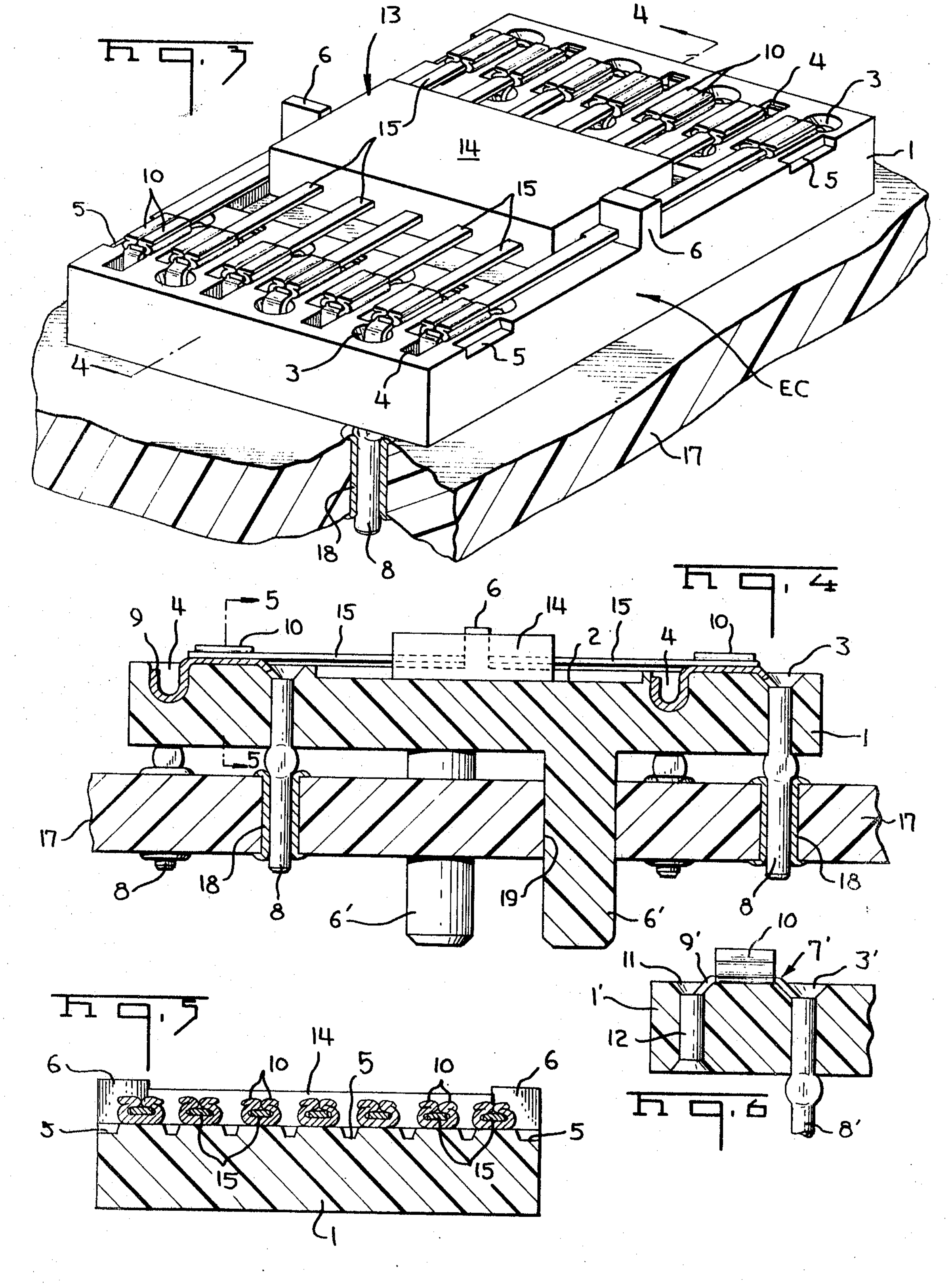
FIG. 3 is a view similar to that of FIG. 1 but showing the electrical connector in position on the mounting means and a micromodular component connected to the electrical connector.
FIG. 4 is a view taken along lines 4—4 of FIG. 3.
FIG. 5 is a view taken along lines 5—5 of FIG. 4.
FIG. 6 is a broken sectional view illustrating an embodiment of the electrical connector.

Electrical connector pins 7 are disposed in dielectric carrier member 1 within each opening 3 and its opposed depression 4 as illustrated in FIGS. 2 and 4. Connector pins 7 comprise pin section 8, flat section 9 and the U-shaped ferrule 10. Flat section 9 extends outwardly from pin section 8 at about a right angle thereto and the legs of ferrule 10 extend outwardly from flat section 9 forming the base of ferrule 10. The free ends of pin sections 8 are beveled to facilitate insertion of the pin sections into a socket member or the like. From an inspection of FIG. 8, the inner half of each leg of ferrule 10 is inclined toward the axis of the ferrule and the outer half of each leg is directed away from the axis at an angular disposition slightly in excess of the angular disposition of the inner halves of the legs. Also, the inner corners 10*a* at the junctions of the base with the leg members are sharp corners, and this is also true for outer corners 10*b* at the junctions of the inner and outer halves of the legs along the exterior surfaces thereof. The thickness of the outer halves of the leg members at 10*c* has been decreased to reduce the outside width without changing the inside dimension. The angles formed by the inner and outer halves of the ferrule are critical to the crimping operation. Surfaces 10*c* are substantially parallel with a plane passing through the axis of the ferrule and normal to the base.

Carrier member 1 is preferably molded from a suitable plastic material in accordance with conventional molding techniques and connector pins 7 are susceptible to mass production by automatic machinery and are conveniently formed by shaping a sheet metal blank or strip of a suitable electrical conductive material in successive forming steps in accordance with conventional stamping techniques.

In assembly to form electrical connector EC, connector pins 7 are disposed within carrier member 1 with pin sections 8 disposed within openings 3 so that ferrules 10 are disposed on the flat upper surface of the carrier member between openings 3, depressions 4 and channels 5 with flat sections 9 extending across depressions 4. The connector pins are securely held in this position while the clinching means and punch means (not shown) respectively clinch pin sections 8 adjacent the bottom surface of carrier member 1 and punch flat section 9 within depressions 4. With pin sections 8 clinched adjacent the bottom surface of carrier member 1, this restricts axial movement of the connector pins, and, with flat sections 9 disposed in depression 4, this defines a wedge-locking means to restrict outward and side-wise movement of the connector pins. Thus, the connector pins are securely held in position with the bases of U-shaped ferrules 10 disposed against the flat upper surface of carrier member 1.

FIG. 6 illustrates an alternative embodiment for securing connector pins 7′ in position within carrier member 1′. In this embodiment, openings 11 are disposed opposite respective openings 3′ and these openings are of identical configuration. The free end of flat section 9′ is formed into a tubular member 12 having a length just long enough to be riveted in position in carrier member 1′ while pin section 8′ is being clinched as illustrated in FIG. 6 so as to secure connector pin 7′ in position. With the arrangement of FIG. 6, the connector pins can be disposed in openings 3′ and 11 in any suitable manner and are not therefore restricted to the staggered arrangement illustrated in FIGS. 1 through 5 so that connector pins 7′ can provide a keying arrangement as desired thereby eliminating the need to provide carrier member 1′ with extensions 6′ to form the keying arrangement.

With connector pins 7 in place within carrier member 1, electrical connector EC is now ready to receive micromodular component 13. This component comprises a generally box-shaped, insulated housing 14 having leads from two to *n* number extending outwardly therefrom. In the illustrated component, leads 15 extend outwardly from each side and from each end. Two leads extend outwardly from each end of housing 14 with one of these leads extending slightly outwardly from its end and then extending parallel with respect to and in the same direction as the leads extending outwardly from one side. The other lead extending outwardly from this end is spaced from the one lead and extends in an opposite direction thereto. Thus, each set of leads at the ends are spaced from each other and extend in opposite directions with respect to each other. Leads 15 are connected to appropriate circuitry within housing 14, and housing 14 is a sealed housing so that at the points of emanation of leads 15 from housing 14, there is a sealed condition thereat. Rupture of any one of these sealed points results in a damaged component which is not susceptible to use.

Figure 8:
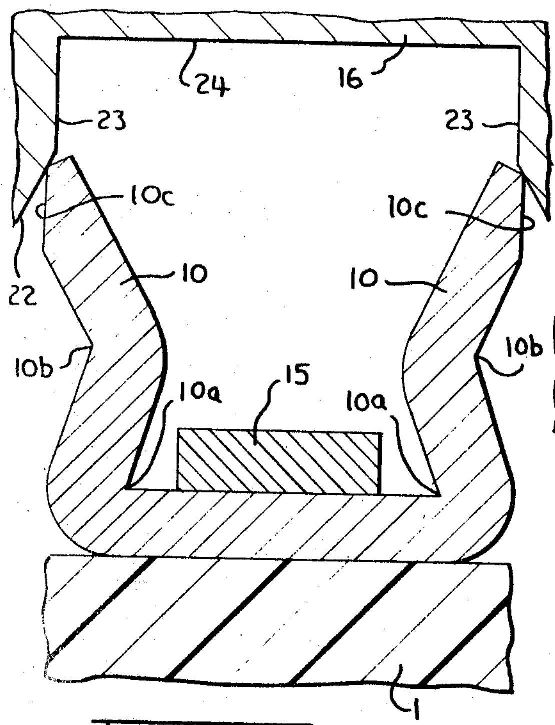
FIGS. 8 through 10 are fragmentary sectional views illustrating the manner in which the side walls of a crimping section are deformed and brought into engagement with a lead during the formation of a crimped connection in accordance with the invention.
Figure 9:
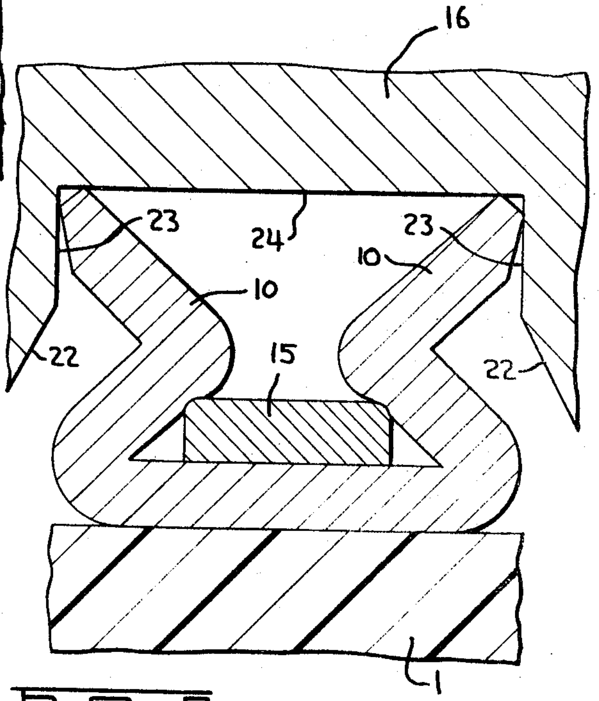
Figures 7, 10:
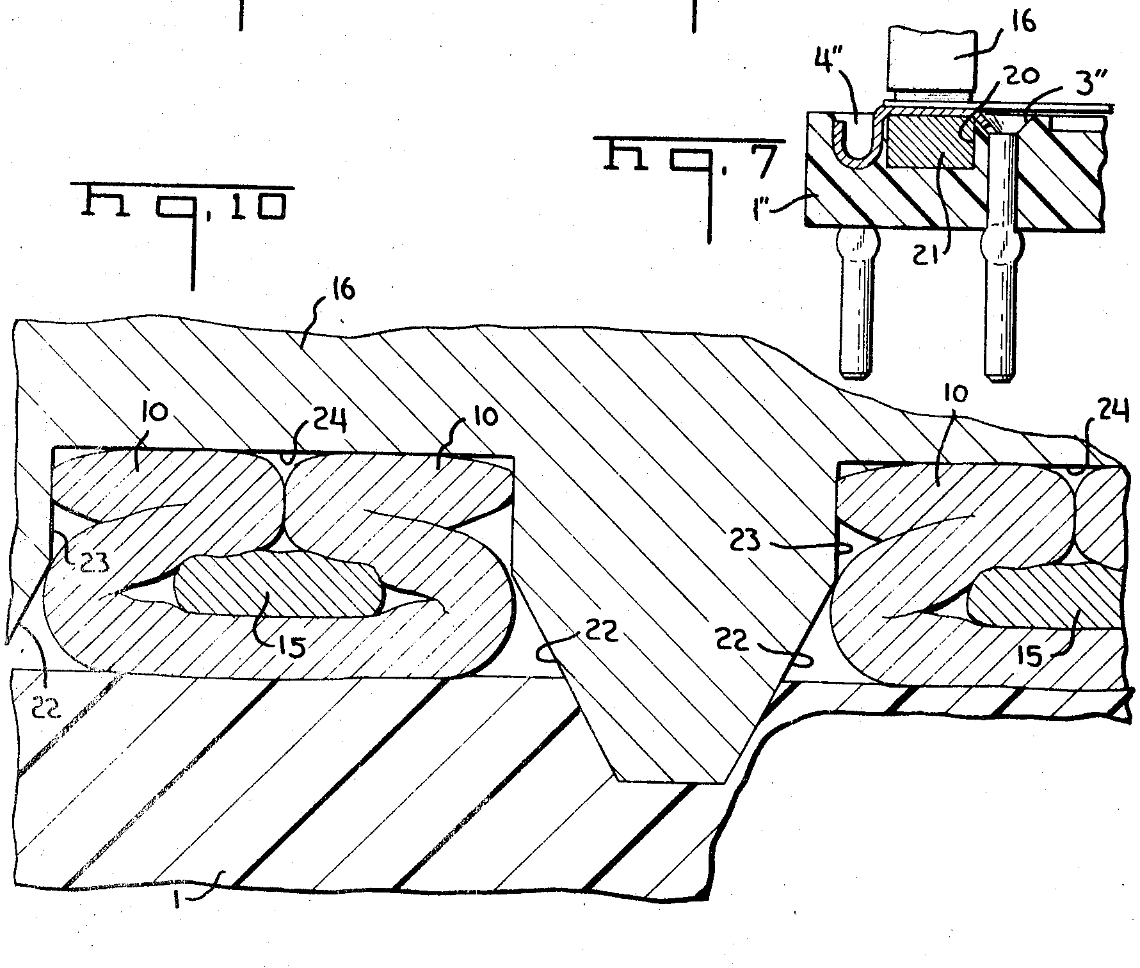
FIG. 7 is a broken sectional view of another embodiment of the electrical connector.

Component 13 is disposed within recess 2 of carrier member 1 and the leads extending outwardly from the ends of housing 14 are placed on each side of projection 6. Thus, projections 6 orient component 13 in position within recess 2 so that leads 15 are properly disposed within respective ferrules 10. With leads 15 properly placed in ferrules 10 and with carrier member 1 and component 13 held in position within a crimping area of a crimping machine (not shown), a crimping die means 16 as illustrated in FIGS. 8 through 10, is brought into engagement with ferrules 10 to subject these ferrules to a crimping operation by the crimping die means to crimp the ferrules to leads 15. The anvil means for crimping die means 16 is provided by the upper surface of carrier member 1 upon which the bases of ferrules 10 rest and channels 5 serve as receiving channels to receive correspondingly shaped teeth of the crimping die means as illustrated in FIG. 10.

Since, as was pointed out hereinabove, it is important that leads 15 are not to be subjected to excessive pressures during the crimping operation in order not to break the seal between housing 14 and leads 15, the crimped connection of the present invention is such that the leg members of ferrules 10 are brought into engagement with leads 15 in such a manner that an excellent mechanical and electrical connection is effected without subjecting leads 15 to crimping pressures that would cause leads 15 to undergo enough movement to break the seal between these leads and housing 14. It is also important to note that anvil means are completely eliminated in the crimping operation of the present invention which simplifies the crimping operation to a great extent. The crimping operation on ferrules 10 can be undertaken to crimp each ferrule 10 individually, crimp ferrules 10 on only one side and then on the other or crimp all the ferrules 10 simultaneously, as desired.

In assembling electrical connectors EC and crimping components 13 thereto, they can readily be subjected to automation capabilities by feeding carrier members 1 to a station, placing pin connectors 7 in openings 3, moving the carrier member and pins in place therein to another station, clinching pin sections 8 and punching flat sections 9 into depressions 4, or riveting tubular members 12 in openings 11 moving the assembled electrical connector to a further station, placing a component 13 within recess 2, moving the electrical connector and component in place thereon to a crimping station, and crimping ferrules 10 onto the leads of component 13, and ejecting the unitary structure of electrical connector EC having crimped thereon component 13 as a pluggable unit for plugging into a mounting member.

If extensions 6′ are located on carrier member 1, one or some of these can be removed prior to or in the crimping station as desired to make sure that the component is properly plugged into the correct position on a mounting member in accordance with the electrical characteristics of the component.

In FIGS. 1, 3, and 4, there is illustrated a mounting member 17, such as, for example, a printed circuit board having sockets 18 disposed therein in a staggered relationship on each side of apertures 19 to receive pin sections 8 of electrical connector EC and extensions 6'. Sockets 18 are connected on either surface of mounting member 17 to appropriate circuitry. As mentioned hereinbefore, the number and location of apertures 19 in mounting member 17 corresponds to the number and location of extensions 6' so that electrical connector EC carrying a certain component 13 having desirable electrical characteristics can only be plugged in the position on the mounting member when these apertures and extensions are in correspondence thereby assuring that components are properly situated on mounting member 17. Of course, extensions 6' may be located on the mounting member for mating relationship with holes disposed in carrier member 1.

If, however, the embodiment of FIG. 6 is used, extensions 6' can be eliminated and connector pins 7' situated in openings 3 and 11' in accordance with a predetermined pattern and sockets 18 are also disposed in mounting member 17 in accordance with the same pattern so that an electrical connector having these connector pins disposed in a pattern corresponding to the similar pattern in mounting member 17 will permit the electrical connector to be plugged into the mounting member at this particular position.

The printed circuit board can be provided with clearance holes to receive the pin sections of the connector pins and these are then subjected to flow solder techniques to solder the electrical connector in position on the printed circuit board and to the appropriate circuitry thereon. The printed circuit board can be supplied with sockets in position therein which are in connection with the circuitry on the printed circuit board and electrical connectors EC having electrical components 13 crimped thereon are mateable with the sockets. Also, terminals having socket members therein provided with posts can be mounted onto a panel which is then program wired, e.g. by conventional point-to-point wiring techniques such as, for example, wrap type techniques or the like to interconnect the components. Other interconnection techniques can, of course, be realized such as socket to printed circuit board etc.

In the event that it is desired to place a metal anvil underneath the bases of ferrules 10, slots 20 may be disposed within carrier member 1" between openings 3" and depressions 4" as illustrated in FIG. 7 to receive anvil members 21 which are disposed within slots 20 beneath the bases of ferrules 10 prior to crimping die means 16 being brought into engagement with the leg members of ferrules 10. Anvils may also be provided for each ferrule by providing holes in carrier member 1 beneath each ferrule, and the carrier member is placed on these anvils so that the bases of the ferrules rest thereon during the crimping operation.

Turning now to FIGS. 8 through 10, as crimping die means 16 descends towards ferrule 10, inclined surfaces 22 engage the outermost parts of the outer halves of the leg members and these outermost parts slide along inclined surfaces 22 as the crimping die means continually moves in its downward direction causing the leg members to bend at corners **10*a* so that the inner halves of the leg members are bent inwardly toward lead 15 disposed in position within the ferrule. When the outermost parts of the leg members move beyond inclined surfaces 22, these outermost parts then move along straight surfaces 23 until they engage bottom surface 24 at the junctions of straight surfaces 23 with bottom surface 24 with surfaces 10*c* being directed towards straight surfaces 23, these outermost parts of the leg members remaining against the junctions of straight surfaces 23 and bottom surface 24** during the remainder of the crimping operation.

After the outermost parts of the leg members are disposed at the junctions of straight surfaces 23 with bottom surface 24 and during the further movement of crimping die means 16 toward carrier member 1, the leg members continue to bend at corners **10*a* and start to bend at corners 10*b* causing the inner halves of the leg members to push against lead 15 and be moved therealong while the outer halves are being moved toward the inner halves, corners 10*a* being moved upwardly as the inner halves of the leg members move along lead 15 until the leg members abut each other at or about the axis of the ferrule. This action continues until the crimping die means bottom in channels 5 and the completely crimped connection is shown in FIG. 10 with the inner halves of the leg members in engagement with lead 15 and pressing the same against the base, the leg members are in abutting engagement at or about the axis of the ferrule and the outer halves of the leg members are in engagement with the inner halves of the leg members. Since lead 15 is spaced from corners 10*a*, this allows lead 15** to flow toward these corners during the crimping operation to preclude any shearing of the lead.

This type of a connection is unique in that the dielectric carrier member forms an anvil means for the crimping means and the ferrule has inner halves of its leg members folded into engagement with the lead to form an electrical connection therebetween and the outer halves of the leg members are folded into engagement with each other and with the lead and the outer halves of the leg members are folded into engagement with the inner halves of the leg members to provide additional residual pressure to confine the lead within the ferrule thereby providing an excellent mechanical and electrical connection without shearing the lead and without extruding it to any extent to break the seal between the lead and its component. While the presently described crimped connection is the most desirable crimped connection to be used in conjunction with the crimping of component 13 onto electrical connector EC, other crimped connections can, of course, be utilized to effect the desired result.

In the event that the crimped connections extrude the leads to an extent whereby the seal connections between the leads and component 13 are affected, and this may occur when using anvil members 21 as illustrated in FIG. 7, leads 15 may be provided with a relief area therein to prevent the leads from breaking the seal during the crimping operation. This relief area can take the form of a small bend in each of the leads.

As can be discerned, there has been disclosed a unique electrical connector for terminating leads of a micromodular component or the like that is highly susceptible to fast terminations therefore being receptive to automation capabilities, that improves the reliability of the termination and that has less complexities and controls as opposed to welding or soldering since the surfaces to be terminated do not have to be prepared, the surfaces do not have to be cleaned, no fluxes are necessary and no preformed jigs or the like are needed to form the crimped terminations. The crimped connections are also submitted to be unique in that these connections are such to provide an excellent mechanical and electrical connection without causing any damage to the component and the material of the dielectric carrier members preferably serves as an anvil means during the crimping operation.

It will, therefore, be appreciated that the aforementioned and other desirable objects have been achieved; however, it should be emphasized that the particular embodiments of the invention, which are shown and described herein, are intended as merely illustrative and not as restrictive of the invention.

The invention is claimed in accordance with the following:

1. The method of crimping a ferrule section of an electrical connector element including a base and leg members defining a substantially U-shape onto an electrical lead comprising the steps of placing said lead against said base; applying pressure to outer halves of said leg members causing said outer halves to move toward each other and inner halves of said leg members to move toward said lead; increasing said pressure while confining said outer halves which causes said inner halves to engage said lead, opposing surfaces at junctions of said inner and outer halves to engage each other and said outer halves to be directed toward said inner halves; and compressing said outer halves against said inner halves with said halves pressing said lead in a confined condition against said base.

2. A crimped electrical connection between an electrical lead and a ferrule portion of a terminal, said ferrule portion having been substantially U-shaped in cross section and having comprised a base and upstanding sidewalls extending outwardly therefrom prior to crimping, said sidewalls having comprised inner and outer sections, said inner sections having been displaced as units during crimping toward said lead and being pressed against an outer surface of said lead and with a junction between the inner and outer sections of one of said sidewalls being in engagement with a junction between the inner and outer sections of another of said sidewalls adjacent said outer surface, said outer sections having been displaced as units during crimping toward said inwardly directed inner sections with said outer sections being disposed in tight engagement with said inner sections and defining free ends extending away from each other, said sections being disposed substantially parallel to said base.

3. The method of forming a crimped electrical connection between an electrical lead and an open U-shape ferrule having a base and upstanding sidewalls on opposite sides thereof comprising the steps of placing said lead on said base; applying a compressive pressure to outermost free ends of said sidewalls causing inner sections of said sidewalls to be bent inwardly toward said lead; confining the outermost ends of the sidewalls as the compressive pressure is being increased; increasing said compressive pressure on the outermost ends causing said inner sections to engage an outer surface of said lead, a junction between the inner and outer sections of one of said sidewalls being in engagement with a junction between the inner and outer sections of another of said sidewalls adjacent said outer surface and outer sections to be bent toward said inner sections with said free ends extending away from each other; and compressing said outer sections against said inner sections with said sections being disposed substantially parallel to said base and confining said lead thereagainst.

References Cited

UNITED STATES PATENTS

| | | | |
|---|---|---|---|
| 2,760,798 | 8/1956 | Evans | 287—49 |
| 2,789,277 | 4/1957 | Schumacher. | |

RICHARD E. MOORE, Primary Examiner

J. H. McGLYNN, Assistant Examiner

U.S. Cl. X.R.

29—509, 515, 626, 628, 629; 174—94